US012159953B2

(12) United States Patent
Güsken et al.

(10) Patent No.: US 12,159,953 B2
(45) Date of Patent: Dec. 3, 2024

(54) SCHOTTKY-BARRIER TYPE INFRARED PHOTODETECTOR

(71) Applicant: Imperial College Innovations Limited, London (GB)

(72) Inventors: Nicholas Alexander Güsken, London (GB); Alberto Lauri, London (GB); Yi Li, Guangdong (CN)

(73) Assignee: IMPERIAL COLLEGE INNOVATIONS LIMITED, London (GB)

( * ) Notice: Subject to any disclaimer, the term of this patent is extended or adjusted under 35 U.S.C. 154(b) by 465 days.

(21) Appl. No.: 17/600,810

(22) PCT Filed: Mar. 31, 2020

(86) PCT No.: PCT/GB2020/050858
§ 371 (c)(1),
(2) Date: Oct. 1, 2021

(87) PCT Pub. No.: WO2020/201740
PCT Pub. Date: Oct. 8, 2020

(65) Prior Publication Data
US 2022/0209038 A1 Jun. 30, 2022

(30) Foreign Application Priority Data

Apr. 1, 2019 (GB) .................................... 1904542

(51) Int. Cl.
H01L 31/07 (2012.01)
H01L 31/02 (2006.01)
H01L 31/18 (2006.01)
(52) U.S. Cl.
CPC ........ H01L 31/07 (2013.01); H01L 31/02019 (2013.01); H01L 31/1804 (2013.01)

(58) Field of Classification Search
None
See application file for complete search history.

(56) References Cited

U.S. PATENT DOCUMENTS 5,443,684 A * 8/1995 Eckart .................. G01B 9/04
257/E21.53
5,814,873 A 9/1998 Konuma
(Continued)

FOREIGN PATENT DOCUMENTS

EP 3301728 A1 4/2018
JP S63308971 A 12/1988

OTHER PUBLICATIONS

International Search Report issued in International Application No. PCT/GB2020/050858 dated Jul. 31, 2020.
(Continued)

Primary Examiner — Bo B Jang
(74) Attorney, Agent, or Firm — Brian J. Colandreo; Jeffrey T. Placker; Holland & Knight LLP

(57) ABSTRACT

The present invention provides an infrared photodetection device for detecting infrared radiation with a wavelength of 700 nm or larger comprising: a carrier transfer member comprised of a non-metallic material with a band gap; an absorber on one side of the carrier transfer member, and in electrical contact with the carrier transfer member, the absorber being a metallic material in which electron-hole pairs are excited upon absorption of infrared radiation; and a semiconductor on the other side of the carrier transfer member, and in electrical contact with the carrier transfer member; and wherein the carrier transfer member contains trap states such that majority carriers excited in the absorber due to infrared radiation are conducted via the trap states through the carrier transfer member to be collected b the semiconductor.

20 Claims, 3 Drawing Sheets

(56) References Cited

U.S. PATENT DOCUMENTS 9,660,117 B1 * 5/2017 Dimmock ......... H01L 31/02327
10,403,781 B1 9/2019 Munday

OTHER PUBLICATIONS

Search Report issued in United Kingdom Application No. GB1904542.6 dated Sep. 20, 2019.
Gusken et al., "TiO2-x-Enhanced IR Hot Carrier Based Photodetection in Metal Thin Film-Si Junctions," ACS Photonics, vol. 6, No. 4 (2019).
Yu et al., "Large Lateral Photovoltaic Effect in Metal-(Oxide-) Semiconductor Structures," Sensors, vol. 10, pp. 10155-10180 (2010).

* cited by examiner

SCHOTTKY-BARRIER TYPE INFRARED PHOTODETECTOR

CROSS-REFERENCE TO RELATED APPLICATIONS

This application is a U.S. National Stage of International Patent Application No. PCT/GB2020/050858, filed 31 Mar. 2020, which claims priority to Great Britain Patent Application No: 1904542.6, filed on 1 Apr. 2019, the disclosures of which are incorporated herein by reference in their entirety.

The present invention relates to an infrared photodetection device for detecting infrared radiation, and to a method for manufacturing such a device.

Photodetection is the use of a device to detect electromagnetic radiation incident on the device, usually by the measurement of a current generated through the device as photons are absorbed. The current generated by the absorption of photons is referred to as a photocurrent. The present invention aims to improve the photodetection of infrared radiation.

A metal/semiconductor junction in which a metal and a semiconductor are brought into close contact will generally form a Schottky barrier. Schottky barriers have rectifying characteristics and thus can be used as a diode. This is a form of non-ohmic electrical contact wherein the electrical resistance is different when a forward bias or reverse bias voltage is applied. This differs from an ohmic contact, as would form between two metals in close contact, which has no difference in resistance under forward or reverse bias voltage.

Extracting energetic carriers from light absorption in so called hot carrier Schottky barrier junctions is a field of active research as it allows harvesting low photon energies that cannot normally be detected by semiconductor photodetectors. Taking silicon photo-detectors (with a band gap energy of 1.1 eV) for instance, exploitation of Schottky barrier devices (pSi/nSi) can result in a highly integrated CMOS compatible and inexpensive alternative to commercially used Germanium and Gallium Arsenic (GaAs) photodetectors for photons with telecommunication wavelengths (1100-1600 nm).

Previous devices have made use of standard p-n junctions between a p-type and an n-type semiconductor in order to achieve charge separation under illumination, and thus a detectable photocurrent. Other devices have made use of metal or metal oxide absorbing layers, with metal oxide being of particular interest for high energy (i.e. UV) photon absorption.

Yu and Wang, Sensors 2010, 10, 10155-10180 discloses lateral photocurrent excitation by ultraviolet light, wherein ultraviolet light is absorbed by a Si substrate. In this device electron/hole pairs are generated by the UV light in the silicon substrate. A $TiO_2$ layer without trap states is provided above the Si substrate with a thickness of 1.2 nm. A Ti layer of 6.2 mn thickness is provided above the $TiO_2$ for use as an electrode and is too thin for substantial electron/hole pair generation by IR light. The device is a lateral-photo-voltage measurement (LPV) device, designed to measure the position of incidence of UV light.

Rahman et al., American International Journal of Research in Science Technology, Engineering & Mathematics, 4(1), 2013, pp. 07-14 discloses a metal/metal-oxide/semiconductor structure with a mixture of $SiO_2$—$TiO_2$ as the metal-oxide interlayer.

Current infrared photodetectors use a pSi/Au type structure. A high intensity of incident radiation is required to inject carriers into the pSi from the Au where electron-hole pairs are generated.

The present invention aims to improve photo responsivity of a device when absorbing infrared radiation so that a detectable photo current is generated at a lower intensity of incident radiation.

SUMMARY OF INVENTION

The present invention provides an infrared photodetection device for detecting infrared radiation with a wavelength of 700 nm or larger comprising: a carrier transfer member comprised of a non-metallic material with a band gap; an absorber on one side of the carrier transfer member, and in electrical contact with the carrier transfer member, the absorber being a metallic material in which electron-hole pairs are excited upon absorption of infrared radiation; and a semiconductor on the other side of the carrier transfer member, and in electrical contact with the carrier transfer member; and wherein the carrier transfer member contains trap states such that majority carriers excited in the absorber due to infrared radiation are conducted via the trap states through the carrier transfer member to be collected by the semiconductor.

In the present invention, the use of a carrier transfer member has been demonstrated to significantly increase photodetection in the infrared region. A carrier transfer member which facilitates carrier transfer across the metal-semiconductor junction has not previously been used, and the increase in photo responsivity of a device containing such a member was discovered for the first time by the inventors.

In an embodiment the thickness of the carrier transfer member between the semiconductor and the absorber is 50 nm or less, preferably 30 nm or less, more preferably 20 nm or less, even more preferably 10 nm or less and most preferably 5 nm or less. This is advantageous because reducing the thickness of the carrier transfer member increases the photo responsivity of the device because the chance of a carrier being conducted through the carrier transfer member via trap states increases with decreasing thickness of the carrier transfer member between the absorber and the semiconductor.

In an embodiment a depletion region exists in the carrier transfer member, adjacent to the semiconductor. This is advantageous because the absence of free carriers in the depletion region reduces the possibility of the majority carriers (holes or electrons) undergoing recombination with minority carriers (electrons or holes) while moving through the carrier transfer layer.

In an embodiment the thickness of the carrier transfer member between the semiconductor and the absorber is not more than 5 times the thickness of the depletion region in the carrier transfer member, preferably no more than 2 times the thickness of the depletion region in the carrier transfer member and more preferably no more than 1.5 times the thickness of the depletion region in the carrier transfer member. This is advantageous because reducing the thickness of the carrier transfer member, as demonstrated by the examples, increases the photo responsivity of the device. The theoretical explanation for this behaviour, to which the applicant does not wish to be held, is that outside the depletion region there is an increased probability of majority carriers undergoing recombination while moving through the carrier transfer layer.

In an embodiment the carrier transfer member has a band gap equal to or larger than that of the semiconductor. This is advantageous because it prevents infrared light from being absorbed by the carrier transfer member.

In an embodiment the carrier transfer member is an amorphous material. This is advantageous because the amorphous structure contains more structural defects than a crystal structure, and thus more trap states capable of facilitating carrier transfer can be formed.

In an embodiment the carrier transfer member is sputtered. This is advantageous because a sputtered structure contains structural defects and facilitates the formation of oxygen vacancies and thus trap states capable of facilitating carrier transfer can be formed in the carrier transfer member.

In an embodiment the carrier transfer member is a metal oxide material. This is advantageous because metal oxides generally have good structural and thermal properties, and usually have a wide band gap.

In an embodiment the metal oxide material is $TiO_{2-x}$ preferably $TiO_{2-x}$. $TiO_{2-x}$ has been demonstrated in the examples of the present description to be an effective material for the carrier transfer member.

In an embodiment the carrier transfer member has an oxygen sub-stoichiometry of 0.1% or more, preferably 5% or more, more preferably 10% or more, more preferably 15% or more and most preferably 20% or more. This is advantageous because trap states are known to form at crystal defect sites, and thus an increase in crystal defects (i.e. oxygen vacancies) allows for more trap states capable of facilitating carrier transfer to be formed.

In an embodiment the infrared radiation has a wavelength of 1100 nm or more, preferably 1150 nm or more and more preferably 1200 nm or more. This is advantageous because telecommunications applications generally use infrared radiation with a wavelength of 1100 nm or more.

In an embodiment the infrared radiation has a wavelength of 1 mm or less, preferably 15 μm or less, more preferably 8 μm or less, more preferably 3 μm or less, more preferably 1600 nm or less, more preferably 1400 nm or less and most preferably 1350 nm or less. This is advantageous because shorter wavelength infrared is generally used in telecommunications applications, which is an area of use that is of particular interest for the present invention.

In an embodiment the absorber is arranged to have two main surfaces parallel to one another and extending in two dimensions, one of the two main surfaces being in contact with the carrier transfer member, the other of the two main surfaces being arranged for absorbing infrared radiation. This is advantageous because this configuration allows for efficient absorption of incident infrared radiation.

In an embodiment the absorber is a metallic material, preferably one or more selected from the list: Au, Ti, $Ti_xN_y$, $In_xSn_yO_z$, Pt, Fe, Cr, Pd, Ag, Al. This is advantageous because metallic materials do not have a band gap, and are therefore capable of absorbing radiation across a wide range of wavelengths to produce electron-hole pairs, and thus majority carriers. The example metals have good mechanical, electrical and thermal properties and can be easily deposited.

In an embodiment the thickness of the carrier transfer member between the semiconductor and the absorber is 0.1 nm or more, preferably 0.5 nm or more and more preferably 1 nm or more. This is advantageous because if the carrier transfer member is too thin it may not contain a sufficient number of trap states to facilitate efficient carrier transfer from the absorber to the semiconductor, and to ensure a uniform and closed layer growth.

In an embodiment the carrier transfer member is an n-type semiconductor. This is advantageous because n-type semiconductors have been demonstrated to form trap states that facilitate carrier transfer from the absorber to the semiconductor, and are thus an effective material for the carrier transfer member.

In an embodiment the semiconductor is doped Si. This is advantageous because Si is a widely used, well studied and inexpensive semiconductor material, capable of being doped such that it is either p-type or n-type.

In an embodiment the semiconductor is a p-type semiconductor. This is advantageous because the trap state facilitated conduction through carrier transfer member has been demonstrated to work well when the majority carrier is holes, as is the case when the semiconductor is p-type.

In an embodiment the photodetection device achieves a photo responsivity of 1 mA/W or more at 1250 nm excitation wavelength when no external voltage is applied. This is a significantly higher photo responsivity than is achieved by a device that does not include a carrier transfer member, which allows for greater sensitivity when detecting incident infrared radiation.

In an embodiment the majority carriers are holes. This is advantageous because the trap state facilitated conduction through carrier transfer member has been demonstrated to work well when the majority carriers are holes.

In an embodiment the roughness Ra of the surface of the absorber in electrical contact with the carrier transfer member is 0.2 nm or more. This is advantageous because increased surface roughness results in an increased surface area between the absorber and the carrier transfer member, which increases the probability of an excited majority carrier passing from the absorber into the carrier transfer member, and thus to the semiconductor.

In an embodiment the infrared photodetection device is configured such that the infrared radiation passes through the semiconductor and the carrier transfer member before being absorbed by the absorber. This is advantageous because it increases the amount of incident infrared radiation that is absorbed by the absorber.

In an embodiment the semiconductor is a silicon substrate that is double side polished. This is advantageous because it increases the amount of incident infrared radiation that is able to pass through the semiconductor layer and be absorbed by the absorber.

In an embodiment a method for manufacturing an infrared photodetection device comprises steps of: providing a semiconductor substrate; depositing a carrier transfer member such that a surface of the carrier transfer member is in electrical contact with a surface of the semiconductor substrate; depositing an absorber such that a surface of the absorber is in electrical contact with a surface of the carrier transfer member.

In an embodiment the method for manufacturing method for manufacturing an infrared photodetection device comprises a step wherein the carrier transfer member is deposited by sputtering. This is advantageous because a sputtered structure contains structural defects and thus trap states capable of facilitating carrier transfer can be formed in the carrier transfer member.

Embodiments of the invention will now be described by way of example only with reference to and as illustrated in the following drawings:

FIG. 1 shows the responsivity of a device comprising a p-doped Si semiconductor, a 5 nm $TiO_{2-x}$, carrier transfer member and an Au absorber, this is compared with the responsivity of a device comprising a p-doped Si semiconductor and an Au absorber (i.e. without a carrier transfer member). The figure clearly shows that the photo responsivity of the device incorporating a carrier transfer member has a photo responsivity an order of magnitude greater than the other device, when the incident radiation has a wavelength of 1250 nm.

Figure 4:
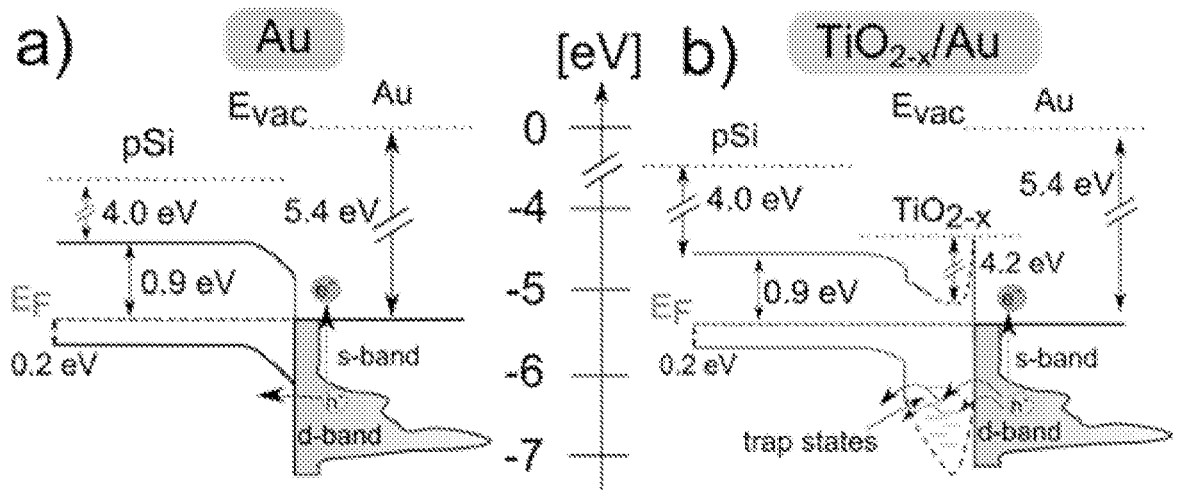

FIG. 4 shows illustrative band energy diagrams showing the simplified band alignment of a) Au/pSi; and b) pSi/TiO$_{2-x}$/Au. The Schottky barrier of pSi/Au has been estimated to P$_B$=0.56 eV from dark IV curves using the thermionic model, while all other energies were extracted from literature. The blue and green arrows indicate the transition of holes and electrons, respectively for excitation energies from 0.77 eV to 1.13 eV.

Figure 5:
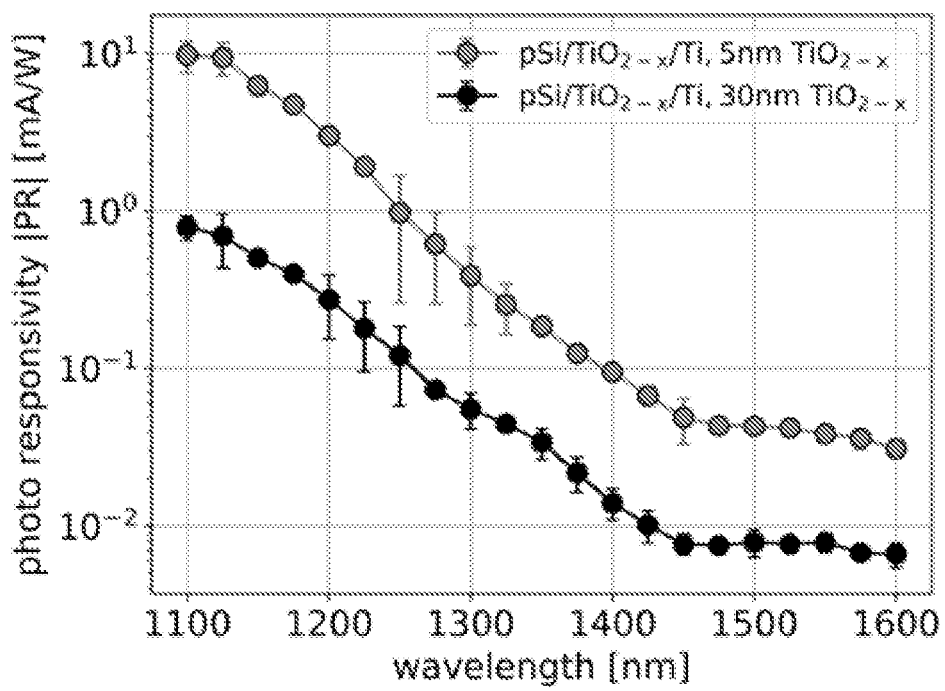

FIG. 5 shows the measured photo responsivity under zero bias for two devices according to the present invention, in which the thickness of the carrier transfer member between the absorber and the semiconductor is 5 nm and 30 nm, at 0.3 mW.

Figure 6:
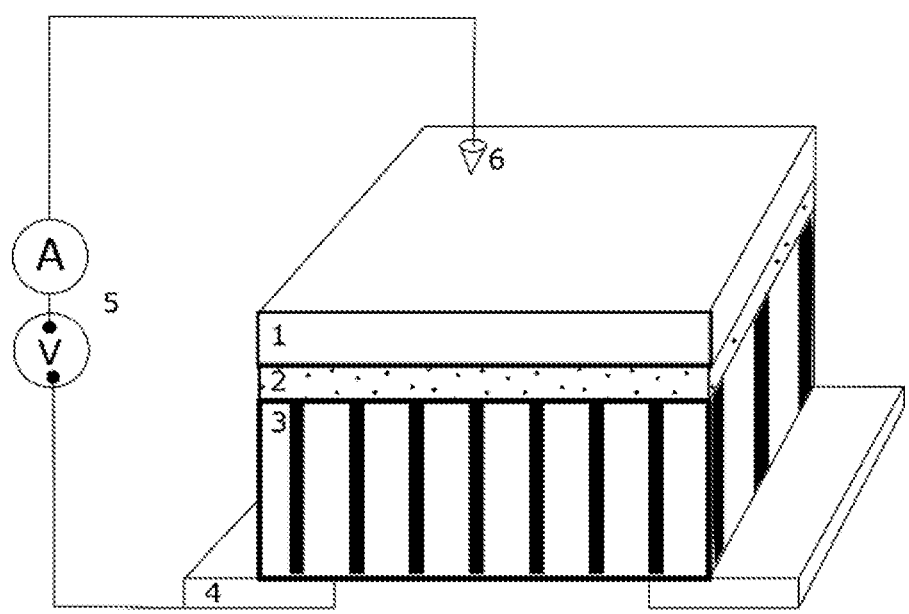

FIG. 6 shows an arrangement of electrodes suitable for measuring the potential difference and/or current flowing between the absorber and semiconductor.

The present invention makes use of photoexcited carriers, rather than bias-voltage driven carriers used in other related devices. The infrared photodetection device of the present invention is based on photoexcitation and not excitation due to an electrical bias and also photoexcitation in the absorber as a result of infrared radiation, rather than photoexcitation in the metal-oxide which would need wavelength in the ultraviolet regime. In alternative device structures disclosed previously, for example pSi/TiO$_2$/metal UV absorbing devices, TiO$_2$ (a material of interest for the carrier transfer member of the present invention) is used either as an absorber (UV range) or as a hole blocking layer or as a poor electrical conductor for testing reasons (determination of the trap state position).

The photodetector of the present invention is for detecting infrared radiation and comprises a semiconductor substrate. A carrier transfer member is deposited on the semiconductor substrate. An absorber is deposited on the carrier transfer member. In this way, the carrier transfer member is sandwiched between the substrate and the absorber. One such structure is pSi/TiO$_{2-x}$/Au as illustrated in the bottom right of FIG. 1.

The absorber is a metallic material in which excited majority carriers are excited when absorbing infrared radiation, by producing electron-hole pairs.

The carrier transfer member contains trap states such that majority carriers excited in the absorber due to infrared radiation are conducted via the trap states through the carrier transfer member to be collected by the semiconductor.

Thus the device of the present invention is suitable to be used as an infrared photodetection device as follows: electron/hole pairs are generated in absorber and either the electrons or the holes are conducted through the carrier transfer member via the trap states and then collected by the semiconductor. The other of the electrons and holes are collected on the electrode in ohmic contact with the absorber layer. A voltage difference measured between the absorber and the semiconductor indicates the presence of IR radiation on the absorber. This is different to Yu and Wang, Sensors 2010, 10, 10155-10180 where electron/hole pairs are generated in the Si substrate by UV light and a position of incident UV light is determined by the potential difference between two electrodes both mounted a distance apart on the metal top layer or both mounted a distance apart on the silicon bottom layer. In the Yu and Wang, Sensors 2010, 10, 10155-10180 device the metal layer is too thin to generate the necessary electron/hole pairs found in the present device and the middle TiO$_2$ layer does not have trap states and is too thin to conduct any electron hole pairs generated in the metal top layer via trap states to the bottom Si layer. The Ti layer is thin to allow high transmission of the UV and thick enough to reduce electrical resistance enough. In the Yu and Wang, Sensors 2010, 10, 10155-10180 device measurement of the photovoltage laterally (LPV contacting) means that any excitation in the metal layer cannot itself lead to a photocurrent generation in the perpendicular direction (i.e. to the semiconductor).

In the present invention, the term 'infrared' refers to electromagnetic radiation with a wavelength between 700 nm (near infrared) to 1 mm (far infrared). A wavelength range of particular interest is the range of near infrared that is commonly used in telecommunications, namely 1100 nm to 1600 nm.

The term 'semiconductor' refers to a material with a band gap. The semiconductor material is either n-type or p-type, depending on the bulk material and any doping of said material. In an n-type semiconductor, the majority carriers are electrons. In a p-type semiconductor, the majority carriers are holes.

The term 'absorber' refers to a material that is suitable for absorbing electromagnetic radiation with an infrared wavelength, which results in the formation of electron-hole pairs in the absorber. Depending on the choice of semiconductor material, and more importantly the majority carrier in the semiconductor material, the electrons or holes excited by infrared absorption in the absorber will move towards the semiconductor (holes will move towards a p-type semiconductor, electrons towards an n-type semiconductor), thus generating a photocurrent.

In the present invention, majority carriers excited in the absorber by the absorption of infrared radiation are transferred from the absorber to the semiconductor through the 'carrier transfer member'. The carrier transfer member is a material containing trap states. The trap states in the carrier transfer member facilitate the conduction of carriers from the absorber to the semiconductor. The trap states allow conduction of carriers to be facilitated through a material which would otherwise act as an insulating blocking layer for carriers.

In the present invention, the absorber is preferably a metallic material that does not have a band gap. Because metals offer zero band gap energy, their use can in principle allow for the absorption and detection of photons in the visible, mid-infrared, terahertz as well as microwave regimes, which holds great promises for gas detection, imaging sensors, wavelength determination, power monitoring and sustainable power supplies. Metallic materials of particular interest for use as an absorber are Au, Ti, Ti$_x$N$_y$, In$_x$Sn$_y$O$_z$, ITO, Pt, Fe, Cr, Pd, Ag, and Al.

Figure 1:
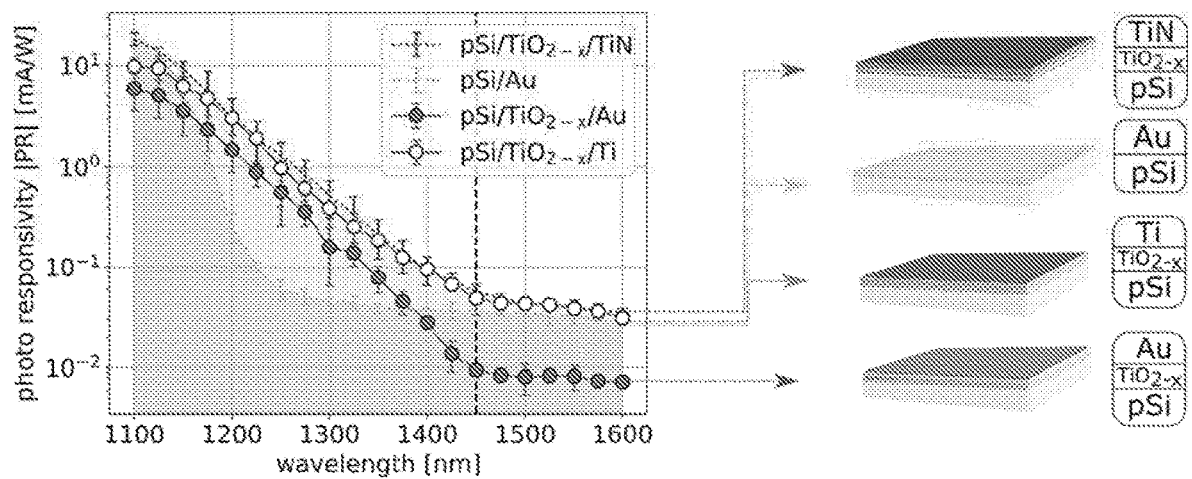

The prior art device shown on the top right of FIG. 1 comprises a pSi/Au device which includes a Schottky barrier junction. Schottky barrier junctions consist of a metal-semiconductor contact in which the difference in the work function of both materials leads to an energy band bending at the interface due to Fermi energy alignment on both sides via charge carrier diffusion and generation currents. Depending on the type of majority carriers in the semiconductor involved (p- or n-type), as well as its band gap energy and respective work function to the metal, an accumulation layer or a Schottky barrier can form. The resulting potential barrier is smaller than the band gap energy of the semiconductor and can thus be overcome by excited carriers from the metal at energies below the semiconductor band gap, which leads to charge carrier separation.

In the present invention an effect which can be described as 'hot-carrier excitation in Schottky-barrier metal/semiconductor devices' is used in a counterintuitive arrangement. In this arrangement, 'hot-carriers' which have been excited in the absorber are collected by the semiconductor. The inventors discovered unexpectedly that collection efficiency in the semiconductor was enhanced when adding a trap state containing layer between the absorber and the semiconductor, which does not absorb infrared radiation, and would not usually be used for carrier conduction. In fact the materials used for the carrier transfer member are known to be carrier blocking materials due to their large band gaps. The inventors discovered for the first time that the inclusion of this member actually enhances the photodetection efficiency in the infrared regime, when it would normally be expected to act as a barrier for carrier conduction.

In the present invention, the device makes use of a structure which is photo-excitation based. This has the advantage that the device works under zero applied electrical bias. The electron-hole separation (or the voltage) across the device barrier is created by the incident infrared light which is absorbed in the absorber layer. The absorption of the infrared light excites carriers which are then consecutively collected by the metal (electrons) and the pSi (holes).

The photo responsivity of a photo detection device is the one of the main properties of merit for photo detectors. In order to measure this, a supercontinuum quasi CW laser source (Fianium) in conjunction with an acousto-optic tunable filter (AOTF) was used to illuminate the samples in a wavelength regime from 1100 nm to 1600 nm. The laser beam was focused via a near infrared optimized 50× objective exhibiting a NA of 0.5 which produces a spot size of <3.9 For backside contacting, the corners of a double side polished Si substrate were scratched and covered with Al forming an ohmic contact with the pSi (500 μm, 15-25 Ωcm), the Al was in contact (via Ag paste) with a gold metal piece on which a tip Au micro probe metal tip was placed. For frontside contacting, the micro probe was directly placed on the sample. It is preferable to use a double side polished substrate to enable light to enter through the semiconductor substrate to create a large absorption in the absorber. This is based on absorption calculations which shows that the direction of incidence and the metal surrounding materials affect the absorption properties strongly. If light can only be incident from the metal side, it may be difficult to gain a high absorption in the absorber. The probes used have a tip size diameter of 2.5 The current was measured by 4 contact measurements via a source measurement unit (SMU, Keithley 236) and recorded using a custom-built Python script connected via GPM and a multifunction I/O device (USB-6343, National Instruments) to the SMU. The photocurrent was maximised in every measurement while assuring that the laser spot was not closer than 10 μm to the metal tip which excludes any direct influence of the tip onto the photocurrent response. FIG. 6 is a schematic diagram showing the setup. The photo responsivity (PR) was then calculated using equation (1) below:

$$PR = \frac{I_{photo} - I_{dark}}{P_{in}}, \quad (1)$$

where $I_{photo}$ is the photo induced current, $I_{dark}$ the dark current and $P_{in}$ the power of the incident laser beam. The metal film thickness of Au (d=19 nm) was chosen based on analytical solution of the Fresnel equations by optimizing the thickness d under the given fabrication conditions.

In order to show the impact of the carrier transfer member and illustrate its relation to the photo responsivity, a comparison between a device according to the present invention and one without a carrier transfer member was performed. The function of the devices on the right hand side of FIG. 1 under zero applied electrical bias is shown in the graph on the left hand side of FIG. 1. Here, the photo responsivity of a pSi/Au Schottky is directly compared to devices containing a 5 nm amorphous $TiO_{2-x}$ carrier transfer member between the semiconductor and the absorber, the absorber being Au (19 nm), TiN (50 nm) or Ti (50 nm). If the absorber is too thin, only a small amount of electron/holes pairs will be generated by the IR light. For this reason, the absorber layer is preferably at least 10 nm thick, more preferably at least 15 nm thick and most preferably at least 20 nm thick. The pSi/Au Schottky barrier exhibits classic Fowler like behaviour, however the addition of a carrier transfer member changes the response drastically. The photo responsivity of the devices containing a carrier transfer member is shown to increase between 1160 nm and 1400 nm by over an order of magnitude. The carrier transfer member containing devices are shown to have a photo responsivity of 1 mA/W or greater at 1250 nm excitation wavelength under zero bias (no external voltage applied). This compares to 0.07 mA/W for the pSi/Au device. The inventors discovered that the introduction of a carrier transfer layer results in a significant improvement in the photo responsivity over the Fowler like behaviour observed in a device containing no carrier transfer member. Thus, the present invention relates to devices which can achieve a photo responsivity of 0.5 mA/W or more at 1250 nm excitation wavelength under zero bias.

In order to measure the photo responsivity, a back-illumination configuration of hot carrier devices was used. In this configuration, the absorption of the infrared radiation only relies on the thickness d of a given material (absorber layer) rather than subwavelength nanostructures which is preferential as the strong photo-absorption is not achieved by plasmonic enhancement but via backside illumination of metallic thin films (d<<λ/2π, with the incident wavelength in air λ) through Si. Using this arrangement, an absorption as strong as 52% has been achieved in a 50 nm TiN thin film by exploiting backside illumination and absorption enhancement via so-called zeroth order Fabry-Perot resonances. This approach bears the advantage that no additional patterning is needed, keeping fabrication steps to a minimum, contrary to the general case of plasmonic nanostructures, nanoparticles or gratings for instance.

It is noted that in FIG. 1 for $pSi/TiO_{2-x}/Au$ the photo responsivity for longer wavelength (>1400 nm) drops by one order of magnitude compared to Au only (i.e. compared to a device with no carrier transfer member). This drop can be understood by considering the lower absorption, A(λ), of the $pSi/TiO_{2-x}/Au$ stack which is approximately ≈11% compared ≈25% in pSi/Au (as calculated by transfer-matrix-method simulations and absorption measurements). The experimental results show that the absorber can be Au, however the invention is not limited to this and any metallic material can be used to generate the electron-hole pairs by absorbing infrared radiation. Suitable examples are Au, Ti, $Ti_xN_y$, $In_xSn_yO_z$, Pt, Fe, Cr, Pd, Ag and Al.

The internal quantum efficiency (IQE) of a photo detection device is a measure of the efficiency with which the device converts absorbed photons into charge carriers. This is independent of absorption. This can be calculated using the equation (2) below:

$$IQE = \frac{PR \cdot hf}{q \cdot A(\lambda)} \quad (2)$$

with q the elementary charge, A (λ) the wavelength dependent absorption and hf the energy of the incident photon.

Figure 2:
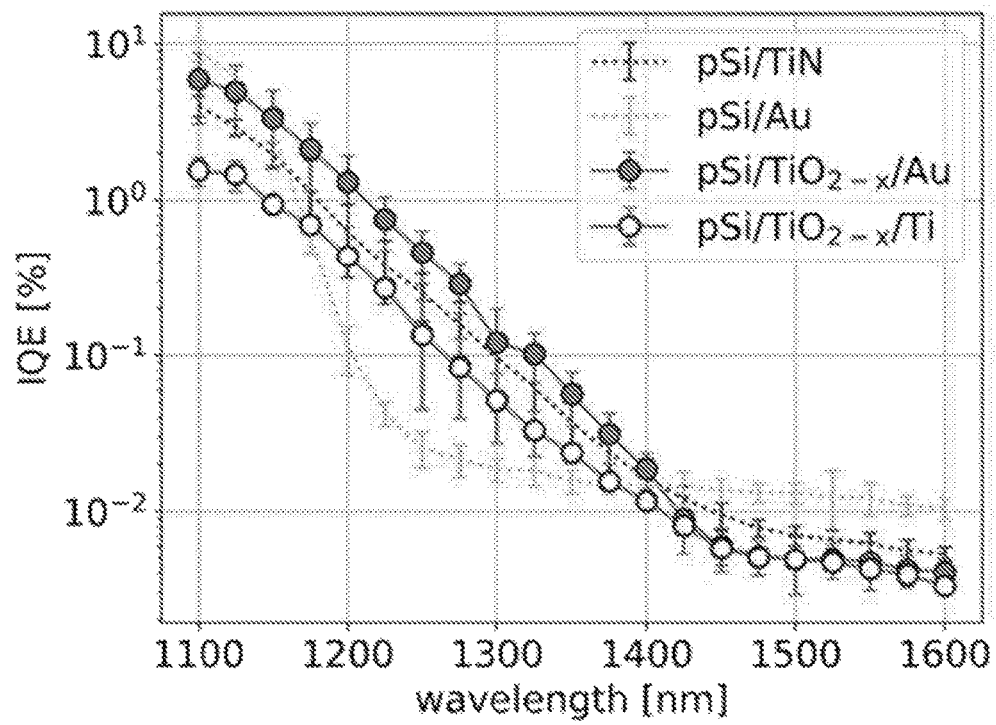
FIG. 2 illustrates the internal quantum efficiency for the samples shown in FIG. 1.

FIG. 2 compares the IQE of devices comprising a p-type Si semiconductor, a TiO$_2$-x carrier transfer member and an absorber (Au, Ti or TiN) with a similar device without a carrier transfer member. The comparison of the IQE of the devices clearly shows that the carrier transfer member is at the core of the significant variation between the photo responsivity. Moreover, the findings show that the inclusion of a carrier transfer member enables strong photo responsivity enhancement compared to a device with no such member, here explicitly shown for an absorber comprising an Au, Ti or TiN thin film. Thus, it can be concluded that the carrier transfer member increases the efficiency with which the device converts absorbed infrared radiation into carriers, and thus measurable photo current.

Transport in the sub-bandgap energy regime in illuminated Schottky barrier junctions can often be explained by the Fowler model. However, a non-Fowler photoemission spectral response occurs in the device of the present invention due to the carrier transfer member containing trap states. These deep level traps can promote majority carrier transfer through the carrier transfer member causing a deviation to the Fowler model, and thus a significantly increased photocurrent. The results in FIGS. 1 and 2 support this, as the carrier transfer member was amorphous TiO$_{2-x}$, in which defects were intentionally introduced by sputtering. The enhanced performance is due to a trap state mediated hole transfer mechanism, with at least some of the trap states being formed at the structural defects introduced into the carrier transfer member due to sputtering. In the examples shown in FIG. 1 the response for wavelengths shorter than 1450 nm is originated in trap state assisted carrier transfer and thus exhibits different behavior from the hot hole excitation over a Schottky barrier observed in a device containing no carrier transfer member. For the particular devices used to produce these examples, the response for wavelengths greater than 1450 nm is thought to be attributed to conduction through pinholes or imperfect tunneling in the carrier transfer member at energies in which trap states are not available. The fact that the oxide containing systems show a stronger photo responsivity than the pSi/Au device, indicates that the carrier transfer member facilitates hole injection into the semiconductor more efficiently than in a standard Schottky barrier interface.

Figure 3:
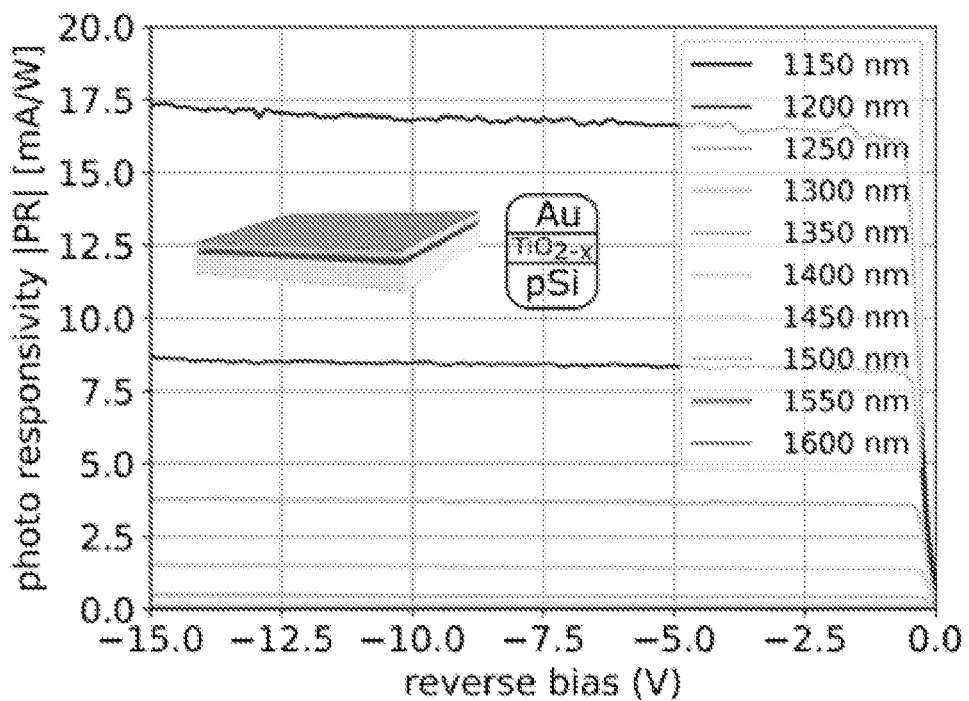
FIG. 3 shows the photo responsivity of a device comprising pSi/TiO$_{2-x}$/metal with applied reverse bias voltage.

In FIG. 3 a device according to the present invention is shown working with an applied reverse bias voltage. The difference in the mechanisms with and without a carrier transfer member become even more apparent when a reverse bias voltage is applied to the device. Applying a reverse-bias potential can enhance the photodetection effect and is of interest for electrical switching applications. As shown in FIG. 3 a device containing a carrier transfer member according to the present invention (pSi/TiO$_{2-x}$/Au) exhibits a saturation behavior rising from ≈0.8 mA/W at zero bias to 4 mA/W at −0.45 V in reverse bias. Here, the breakdown occurs just below −15 V. The spectral dependence can be attributed to the fact that higher energies are able to excite a wider range of carriers in the metal which are consecutively available for transfer. The photo current in diodes is created via electron-hole pair generation in the p-n depletion region and from trap states in the bandgap. The infrared absorption in the pSi/TiO$_{2-x}$ depletion region in the device according to the present invention is negligible as the TiO$_{2-x}$ is only 5 nanometers thick. This indicates that the high photo responsivity results from carriers (holes in this case) which are excited in the metal and transferred consecutively via trap states, giving rise to a significantly different photo responsivity under reverse bias compared to the comparative example (pSi/Au with no carrier transfer member) in which the hot carriers (holes) are transferred over the barrier.

In order to help explain the effect of including a carrier transfer member, band model diagrams are depicted in FIG. 4. The band model diagram of a TiO$_{2-x}$ free pSi/Au system is shown in FIG. 4a), illustrating hot hole excitation and transfer over the Schottky barrier at the pSi/Au interface upon incident illumination which can be described by the Fowler model. FIG. 54b) shows the p-type semiconductor/n-type carrier transfer member/absorber system (in particular the pSi/TiO$_{2-x}$/Au system), taking the TiO$_{2-x}$ carrier transfer member into account. Amorphous TiO$_{2-x}$ possesses a bandgap energy of about 3.2 eV, which is lower than that of the semiconductor (~1.1 eV in the case of Si), and thus constitutes a hole barrier which is usually too large to be overcome by the excitation energies considered here (1.1 eV-0.77 eV). However, two modifications of this hole blocking interlayer can give rise to the hole conduction observed. First, inter-bandgap trap states in amorphous TiO$_{2-x}$ allow for trap state assisted hole transfer, illustrated in FIG. 4. Second, the ≈5 nm thin TiO$_{2-x}$ interlayer is strongly affected by band bending at both interfaces, resulting in an effectively lower bandgap than 3.2 eV. Based on the carrier density in the pSi and the TiO$_{2-x}$ we estimated a depletion region width of approximately 10 nm in the TiO$_{2-x}$ at the pSi/TiO$_{2-x}$ interface via Poisson's equation (discussed in more detail below). This gives rise to a steep band profile as schematically indicated in FIG. 4b). The values for the hole barrier height extracted from dark IV measurements lay close to 0.85 eV for all TiO$_{2-x}$ containing systems examined. The similarity of the values is due to the fact that the pSi/TiO$_{2-x}$ interface determines the hole barrier, and so the TiO$_{2-x}$/metal barrier can be neglected. This is in reasonable agreement with the barrier height estimate of 0.8 eV which takes pinning at the charge neutrality level into account. Furthermore, the measured Schottky barrier corresponds also to the cut-off value at 1450 nm, which can be understood by the fact that a Schottky barrier impedes the transfer of holes with less energy than the Schottky barrier height.

The important property of TiO$_{2-x}$ is that it has trap states. Any material that has trap states may be suitable. Typical suitable materials are those with a band gap equal to or larger than that of the semiconductor. Metal oxides may be particularly suited. Oxygen depletion of the metal oxide can ensure trap states are present, because trap states are known to form at structural defect such as oxygen vacancies. In particular, it is preferable that the material is oxygen depleted such that it has a sub-stoichiometry (i.e. a percentage of oxygen missing from the structure) of 0.1% or more, more preferably 5% or more, more preferably 10% or more, more preferably 15% or more and most preferably 20% or more.

Trap states can be formed as structural defect other than oxygen vacancies, and thus any structural defects may be beneficial. In particular, it is preferable that the material of the carrier transfer member be in an amorphous state. This is because an amorphous material has many more structural defects than a crystalline material, and so additional trap states may be formed.

It is also preferable that the carrier transfer member be sputtered. This is because sputtering is known to result in structural defects, which may form additional trap sites.

The depletion region will lead to an effectively reduced bandgap and an accumulation of charges on either side of the semiconductor/carrier transfer barrier interface. Both, the reduced bandgap as well as the accumulation of charges can affect carrier transport. As discussed above, if the carrier transport member is thicker between the absorber and the semiconductor than the depletion region width, the photo responsivity is reduced. This would be in line with the fact that the depletion as well as the reduced bandgap has an impact. However, it may also be due to the case that trap-state transfer becomes less efficient as a transport process over longer distances.

The widths of the depletion region at the semiconductor/carrier transfer member interface can be calculated using equation (3) below, which is derived from Poisson's equation. In the example below, the calculation has been performed for a $pSi/TiO_{2-x}$ junction. However clearly this equation can be used to calculate the depletion region in the carrier transfer member for any semiconductor/carrier transfer member junction by substituting in the appropriate values for the materials properties required.

$$w_{n,TiO_2} \approx \left( \frac{2\varepsilon_{TiO_2} V_d}{q} \frac{n_A/n_D}{n_A + n_D} \right)^{1/2} \quad (3)$$

where q is the elementary charge, $\varepsilon_{TiO_2} \approx 8.7 \times 10^{-10}$ F·m$^{-1}$ the $TiO_{2-x}$ permittivity, $V_d$ the built in potential for which a conservative estimate of $V_d \approx 0.6$ V is used assuming a Fermi level position of $\approx 0.2$ eV above the valence band ($E_F - E_V = kT \cdot \ln(1.04 \cdot 0.10^{19}$ cm$^{-3}/n_A$)) in pSi and 0.3 eV below the conduction band in $TiO_{2-x}^{14}$, the carrier densities in the boron doped silicon and the n-type $TiO_{2-x}$ are $n_A \approx 9 \times 10^{14}$ cm$^{-3}$ (information from manufacturer) and $n_D \approx 4 \times 10^{16}$ cm$^{-3}$ $2.2 \times 10^{17}$ cm$^{-3}$, respectively.

The depletion region is independent of carrier transfer member thickness but depends on the carrier density inside the adjacent materials. As such there is an infinite number of combinations of different materials which can fulfil the thickness requirements relative to the depletion region size as defined below and it is the combination of adjacent materials which determines the depletion region size.

Based on the values given we calculate a conservative estimate for the depletion region width of the n-type $TiO_{2-x}$ region with $w_{n,TiO_2} \approx 9$ nm and an approximate pSi space charge region width of $w_D \approx 0.9$ μm.

As discussed previously, if the carrier transfer member is significantly thicker than the depletion region, electron hole recombination can occur and thus the photo responsivity of the device will be reduced. This behavior is illustrated by comparing different thickness of the carrier transfer member ($TiO_{2-x}$). FIG. 5 illustrates the measured photo responsivity for a 5 nm and 30 nm $TiO_{2-x}$ carrier transfer member. Absorption in the absorbers of each device were shown to deviate by less than 8%, however the device incorporating the 30 nm barrier transfer member exhibited a photo responsivity reduction of over one order of magnitude compared to the 5 nm device. This indicates that carriers produced in the absorber travel to the semiconductor interface ($pSi/TiO_{2-x}$) where they participate in the trap state assisted carrier excitation and are consecutively injected into the pSi. With increasing carrier transfer member thickness, fewer holes can travel to the depletion region as they are blocked by the carrier transfer member bandgap or undergo recombination in the carrier transfer member (an effect that is particularly strong in the n-type $TiO_{2-x}$ carrier transfer member). Therefore, it is preferably that the thickness of the carrier transfer member between the absorber and the semiconductor is no more than 5 times the thickness of the depletion region (e.g. as calculated using equation 3) in the carrier transfer member, more preferably no more than 2 times the thickness of the depletion region in the carrier transfer member and most preferably no more than 1.5 times the thickness of the depletion region in the carrier transfer member.

Put into physical sizes shown experimentally to be functional, it is preferable that the thickness of the carrier transfer member between the semiconductor and the absorber is 50 nm or less, more preferably 30 nm or less, still more preferably 20 nm or less, even more preferably 10 nm or less and most preferably 5 nm or less.

If the carrier transfer member is extremely thin between the absorber and the semiconductor, it is possible that there will be an insufficient number of trap states in order to facilitate transfer of carriers from the absorber to the semiconductor. Therefore, it is preferable that the thickness of the carrier transfer member between the semiconductor and the absorber is 0.1 nm or more, more preferably 0.5 nm or more, even more preferably 1 nm or more, and even more preferably 2.0 nm or more in order to ensure a sufficient number of trap states to achieve proper conduction through the carrier transfer member. Most preferably the carrier transfer member has a thickness of 3.5 nm or more for the same reason.

The absorber layer can be arranged to have two main surfaces parallel to one another and extending in two dimensions, one of the two main surfaces being in contact with the carrier transfer member, the other of the two main surfaces being arranged for absorbing infrared radiation. However, the structure of the absorber layer is not necessarily limited to having flat main surfaces. In order to increase infrared photon absorption, the absorber may have a patterned structure. The absorber may have holes, may be a grid, may be comprised of spheroidal particles or may have a three-dimensional polygonal shape such as a pyramid. It is preferable that the absorber has a minimum surface roughness (Ra) of 0.2 nm on the surface that is in contact with the carrier transfer member, in order to increase the surface area of the contact and thus facilitate the movement of carriers from the absorber to the carrier transfer member.

The examples of the present invention discussed above demonstrate Si-compatible sub-bandgap photodetection at zero bias for a backside illuminated Au thin film on a p-type Si substrate, exhibiting a photo responsivity of 1 mA/W at 1250 nm. The carrier transfer member disposed between semiconductor and the absorber is the origin of a distinct photo response which significantly differs from that of a comparison device with no carrier transfer member. Further to this, a 5 nm amorphous $TiO_{2-x}$ carrier transfer member between a pSi substrate and a metal thin film is shown to result in an increase in photo responsivity at zero bias of about one order of magnitude compared to similar device with no amorphous $TiO_{2-x}$ carrier transfer member. A clear photo responsivity enhancement was measured for Au thin films. The findings suggest that the absorber (Au in the examples) merely acts as an absorber enabling carrier transfer via carrier transfer member ($TiO_{2-x}$ in the examples) trap states and consecutive collection in the semiconductor (pSi in the examples). This result is promising as absorption in the absorber can be further enhanced by nano-structuring to access plasmonic resonances. Additionally, the photo responsivity of pSi/TiO$_{2-x}$/Au can be increased from about 0.8 mA/W to 4 mA/W at zero and 0.45 V reverse bias, respectively allowing for bias dependent photo switching.

The present invention discloses that the enhanced photo response of a photodetector in the infrared spectrum is directly linked to trap states in the carrier transfer member. We show that a semiconductor substrate in conjunction with a carrier transfer member can serve as a platform for photo current enhancement of various absorber materials, such as Au and Ti. Moreover, the photo response of an Au absorber with a TiO$_{2-x}$ carrier transfer member and a pSi semiconductor can be increased to about 4 mA/W under 0.45 V reverse bias at 1250 nm, allowing for controlled photo switching. A clear deviation from the typically assumed Fowler-like response is observed and an alternative mechanism is proposed to account for the carrier transfer member, capable of facilitating carrier transport.

The description and examples of the infrared photodetection device according to the present invention have been mainly directed towards the three structures illustrated in FIG. 1, namely pSi/TiCh-x/Au, pSi/TiCE-x/Ti and pSi/TiCh-x/TiN. These structures are indeed preferable, however the invention is not limited to only these preferred structures. Examples of alternative structures of interest are the combinations of HfOx, ZrOx, VOx, Nb?O, Ta20x, NiOx and WOx for the carrier transfer member and GaAs, InGaAs, GaP, InGaP, GaN, InGaN as well as (beta-) Ga2Ch for the semiconductor substrate material and Au, Ti, TixNy, InxSnyOz, ITO, Pt, Fe, Cr, Pd, Ag, Al for the metal absorber layer.

The semiconductor in the examples is p-doped silicon. However, the semiconductor according to the present invention is not particularly limited. P- or n-doped Si has been demonstrated to be a suitable material. The important feature of the semiconductor is that it is p- or n-type (or capable of being p- or n-doped), such that it is able to conduct the majority carriers that are generated in the absorber and move through the carrier transfer member via the trap states. In the case where the semiconductor is p-doped, the majority carriers are holes. In the case where the semiconductor is n-doped, the majority carriers are electrons.

The semiconductor can be a different material than silicon. A semiconductor material with a larger bandgap than silicon would increase the range of the photoexcitation carrier transfer mechanism described above in a photodetector device used for detecting radiation with a shorter wavelength than 1150 nm. Examples of alternative materials of interest are GaAs, InGaAs, GaP, InGaP, GaN, InGaN as well as (beta-)Ga$_2$O$_3$.

The carrier transfer member in the examples is TiO$_{2-x}$. However the material for the carrier transfer member according to the present invention is not particularly limited. In the case where the semiconductor is a p-doped material, it is advantageous that the carrier transfer member be an n-type semiconductor, such that a depletion region will form in the carrier transfer member adjacent to the semiconductor. As previously discussed, this is advantageous for avoiding carrier recombination in the carrier transfer member. Examples of alternative materials of interest are HfO$_x$, ZrO$_x$, VO$_x$, Nb$_2$O$_x$, Ta$_2$O$_x$, NiO$_x$ and WO$_x$ for the carrier transfer member.

The infrared photodetection device of the present invention can be easily manufactured by any suitable method. An example method comprises steps as follows:

providing a semiconductor substrate depositing a carrier transfer member on a surface of the substrate, such that the surface of the carrier transfer member is in contact with a surface of the substrate depositing an absorber on the other surface of the carrier transfer member The skilled person would understand that the exact method and conditions for the deposition of each feature will vary depending on the exact materials used. Sputtering, atomic layer deposition (ALD), sol-gel method, metal-organic chemical vapour deposition (MoCVD), molecular-beam epitaxy (MBE) and plasma oxidation are all methods that may be appropriate for use in manufacturing the device. Example conditions suitable for manufacturing the layers in a device according to the present invention are given below.

Sputtering—In order to produce a TiN absorber and TiO$_{2-x}$ carrier transfer member, a 50 nm thick TiO$_x$N$_y$ thin film is deposited by RF reactive magnetron sputtering, from a high-purity Ti (99.995%) target (Pi-kem), using a MANTIS Deposition System at 600° C. The deposition was carried out using a gas mixture of Ar and N$_2$ with a total constant pressure of 0.2 Pa. A standard chromium etchant containing ceric ammonium nitrate was used to remove the chromium mask and the TiO$_x$N$_y$ residues on top of the mask. The sample was rinsed with DI water and evaporated with Al on the other side to complete the fabrication process as described above. Ti and Au were deposited via sputtering and thermal evaporation, respectively in an Angstrom vacuum deposition chamber.

Atomic-layer-deposition (ALD)—For the ALD (Cambridge Nanotech) of TiO$_{2-x}$-x a standard two-pulse system of water and the TDMAT precursor can be used with a 0.2 s water pulse followed by a 7 s delay and a 0.4 s TDMAT pulse followed by a 10 s delay. The system can be left under continuous 20 cm$^3$/min flow of N$_2$ carrier gas and should be maintained at 90° C. throughout the process. This leads to an overall deposition rate of ~0.7 nm per cycle.

Sol-gel method—A sol-gel solution of TiO$_2$ is prepared using titanium tetraisopropoxide and isopropyl alcohol. After aging the solution for 24 hours, it is filtered and then used for growing the n-TiO$_{2-x}$ layer (of thickness 120 nm) on p-Si substrates using spin coater unit (TSE, SPM-150LC). The TiO$_{2-x}$ film is then annealed in Ar gas atmosphere at pre-optimised temperature of ~550° C. for 20 min.

The structure of the device is illustrated schematically in FIG. 6. In FIG. 6 the absorber 1 is shown on top of the carrier transfer member 2 which is on top of the semiconductor 3. The absorber 1 and semiconductor 3 are in ohmic contact with electrodes 4 and 6. Two electrodes 4 are shown attached to the outer surface of the semiconductor 3 (the surface opposite to the carrier transfer member 2). Only one electrode 4 may be present or more than two electrodes 4 may be present, their size and location on the outer surface of the semiconductor 3 are not limited. An electrode 6 in contact with the absorber is present. The electrode 6 can be of any type and location on the outer surface of the absorber 1 (the surface of the absorber opposite to the carrier transfer member 2). The electrodes 4,6 may be silver paste, alloying or simple metal probe tips. Circuitry 5 is provided to measure the potential difference between and/or current following between the absorber 1 and the semiconductor 3, for example using a voltmeter or ammeter.

The invention claimed is:

1. An infrared photodetection device for detecting infrared radiation with a wavelength of 700 nm or larger comprising:

a carrier transfer member comprised of a non-metallic material with a band gap;

an absorber on one side of the carrier transfer member, the absorber being a metallic material in which electron-hole pairs are excited upon absorption of infrared radiation; and a semiconductor on the other side of the carrier transfer member, and in electrical contact with the carrier transfer member; and wherein the carrier transfer member contains trap states such that majority carriers excited in the absorber due to the infrared radiation are conducted via the trap states through the carrier transfer member to be collected by the semiconductor; and wherein the carrier transfer member is a metal oxide material with an oxygen sub-stoichiometry of 0.1% or more, the oxygen sub-stoichiometry being a percentage of oxygen missing from a structure of the metal oxide.

2. The infrared photodetection device according to claim 1, wherein a thickness of the carrier transfer member between the semiconductor and the absorber is 50 nm or less.

3. The infrared photodetection device according to claim 1, wherein a depletion region exists in the carrier transfer member, adjacent to the semiconductor.

4. The infrared photodetection device according to claim 3, wherein a thickness of the carrier transfer member between the semiconductor and the absorber is not more than 5 times a thickness of the depletion region in the carrier transfer member.

5. The infrared photodetection device according to claim 1, wherein the carrier transfer member has a band gap equal to or larger than that of the semiconductor.

6. The infrared photodetection device according to claim 1, wherein the carrier transfer member is an amorphous metal oxide material.

7. The infrared photodetection device according to claim 1, wherein the infrared radiation has a wavelength of 1100 nm or more.

8. The infrared photodetection device according to claim 1, wherein the absorber is arranged to have two main surfaces parallel to one another and extending in two dimensions, one of the two main surfaces being in contact with the carrier transfer member, the other of the two main surfaces being arranged for absorbing the infrared radiation; and wherein the absorber comprises at least one selected from the group containing Au, Ti, $Ti_xN_y$, $In_xSn_yO_z$, Pt, Fe, Cr, Pd, Ag, and Al.

9. The infrared photodetection device according to claim 1, wherein a thickness of the carrier transfer member between the semiconductor and the absorber is 0.1 nm or more.

10. The infrared photodetection device according to claim 1, wherein the metal oxide material of the carrier transfer member is an n-type semiconductor or a p-type semiconductor.

11. The infrared photodetection device according to claim 1, wherein the photodetection device achieves a photo responsivity of 0.5 mA/W or more at 1250 nm excitation wavelength when no external voltage is applied.

12. The infrared photodetection device according to claim 1, wherein the majority carriers are holes.

13. The infrared photodetection device according to claim 1, wherein the absorber is arranged to have two main surfaces parallel to one another and extending in two dimensions, one of the two main surfaces being in electrical contact with the carrier transfer member, and wherein the said one of the two main surfaces in electrical contact with the carrier transfer member has a roughness Ra of 0.2 nm or more.

14. The infrared photodetection device according to claim 1, wherein the infrared photodetection device is configured such that the infrared radiation passes through the semiconductor and the carrier transfer member before being absorbed by the absorber.

15. The infrared photodetection device according to claim 1, wherein the absorber has a thickness of at least 10 nm.

16. The infrared photodetection device according to claim 1, further comprising circuitry to measure a potential difference or current flowing between the absorber and the semiconductor.

17. A method of detecting infrared radiation with a wavelength of 700 nm or larger using the infrared photodetection device of claim 1, the method comprising exposing the absorber to the infrared radiation and measuring a potential difference or current flowing between the absorber and the semiconductor.

18. A method for manufacturing the infrared photodetection device according to claim 1, the method comprising steps of:

providing the semiconductor;

depositing the carrier transfer member such that said other side of the carrier transfer member is in electrical contact with a surface of the semiconductor; and depositing the absorber such that a surface of the absorber is in electrical contact with a said one side of the carrier transfer member.

19. The method of claim 18, wherein the carrier transfer member is deposited by sputtering.

20. The infrared photodetection device according to claim 1, wherein the infrared radiation has a wavelength of 1 mm or less.

* * * * *